United States Patent
Feldman et al.

[11] Patent Number: 6,124,924
[45] Date of Patent: Sep. 26, 2000

[54] FOCUS ERROR CORRECTION METHOD AND APPARATUS

[75] Inventors: Haim Feldman, Nof-Ayalon; Ron Naftali, Kiriat Ono; Gilad Almogy, Givatayim; Amir Komeem, Tel Aviv, all of Israel

[73] Assignee: Applied Materials, Inc., Santa Clara, Calif.

[21] Appl. No.: 09/220,340

[22] Filed: Dec. 24, 1998

[51] Int. Cl.[7] .................................................. G01B 11/26
[52] U.S. Cl. ........................................... 356/153; 356/399
[58] Field of Search .................................. 356/399, 400, 356/401, 138, 140, 153

[56] References Cited

U.S. PATENT DOCUMENTS

| | | | |
|---|---|---|---|
| 4,123,652 | 10/1978 | Bouwhuis | 250/204 |
| 4,903,066 | 2/1990 | Moriyama et al. | |
| 5,563,702 | 10/1996 | Emery et al. | 356/73 |
| 5,570,189 | 10/1996 | Salmon | 356/399 |
| 5,673,101 | 9/1997 | Tenner et al. | 356/401 |

*Primary Examiner*—Robert H. Kim
*Assistant Examiner*—Tu T. Nguyen
*Attorney, Agent, or Firm*—Sughrue, Mion, Zinn, Macpeak & Seas, PLLC

[57] ABSTRACT

Scanning method and apparatus for maintaining a desired position of an article are presented. The apparatus comprises an illumination unit, a focusing optics and a focus detection unit. The illumination unit generates an incident light beam for illuminating an elongated region of the article and producing light returned from the illuminated region. The focusing optics focuses the incident beam onto a focal plane and collects at least a portion of the returned light. The focus detection unit comprises an imaging optics and a detector having a sensing surface responsive to light impinging thereon for generating data representative thereof. The imaging optics is capable of forming first and second images on the sensing surface. The first and second images are formed by first and second spatially separated substantially identical light components of the collected returned light, respectively, which propagate symmetrically relative to an optical axis of the focusing optics. A position of the first image relative to the second image is indicative of the position of the article relative to the focal plane.

32 Claims, 4 Drawing Sheets

FOCUS ERROR CORRECTION METHOD AND APPARATUS

FIELD OF THE INVENTION

This invention is in the field of auto-focusing techniques and relates to a method and apparatus for maintaining a desired position of an article and utilizing focus error correction.

BACKGROUND OF THE INVENTION

There is a great variety of optical systems used for inspection/measurements of articles, reading/recording information in an information carrier, etc. These systems typically comprise an illumination means equipped with suitable light directing optics, and a detection means equipped with light collecting optics. A system of this kind always utilizes a focus error correction technique to ensure that the article under inspection (or an addressed layer of the information carrier) is located in a focal plane defined by the light directing optics.

One conventional auto-focusing technique is disclosed, for example, in U.S. Pat. Nos. 4,123,652 and 5,563,702, where the technique is used for reading a radiation-reflecting record carrier and for photomask inspection, respectively. According to this technique, a light beam scattered from the article is directed through anamorphic elements, and the shape of the light beam cross-section after passing these elements is monitored. The basic principle underlying the implementation is that a cylindrical lens produces astigmatism. A focused beam is first displaced from an in-focus point in a first direction and then in a second direction perpendicular to the first direction. The beam cross section therefore changes from being oblong in the first direction through circular to oblong in the second direction. Thus, an auto-focus beam is typically split into a pair of sub-beams, which propagate along mutually perpendicular optical paths onto a pair of detectors through a pair of astigmatic elements, respectively. The detectors are quadrature photodiodes. When the article is in focus, both detectors are illuminated by a circular beam. As the article goes out of focus, the horizontal diameter of the beam decreases on one detector and increases on the other. This changes the electrical output from the quadrature detectors and the focus correction signal is thus calculated accordingly.

However, the above technique detects focal point displacement by monitoring different points' locations. This is not suitable when dealing with a patterned article, because the pattern may produce intensity differences at different locations relative to a specific feature of the pattern. As a result, focus corrections may be applied to the detected, supposedly out-of-focus point, while being (i.e. inspecting) in an out-of-focus plane. In other words, the above technique cannot be used when illuminating a line, which is typically the case in the inspection of patterned articles.

Another technique, disclosed in Japanese Patent No. 01-202708 assigned to Nikon Corporation, JP, utilizes a pupil-dividing prism. The prism is placed in a pupil location, and forms an image of an illuminated area on a detector. The obtained image is divided into two spatially separated image parts, when the illuminated area is out of focus of a focusing optics. However, the same two-part image is provided on the detector in both before-focus and after-focus locations of the illuminated area. Consequently, this technique, even through it is capable of detecting the out of focus position, fails to provide correct information as to whether this out of focus position corresponds to the before-focus or after-focus location of the illuminated area, for generating a focus error correction signal.

SUMMARY OF THE INVENTION

There is accordingly a need in the art to improve auto-focusing techniques by a novel method and apparatus for maintaining a desired position of an article.

A major object of the present invention is to provide such a method and apparatus that enable advantageous detection of an out-of-focus position of the article for maintaining accurate focusing of an incident beam employed in an optical system applied to the article.

It is a further object of the present invention to provide such a method that allows for detecting a position of the plane defined by the article relative to the focal plane of the optical system.

There is provided, according to one aspect of the present invention, an optical apparatus for maintaining a desired position of an article, the apparatus comprising:

(a) an illumination unit generating a light beam for illuminating an elongated region of the article and producing light returned from the illuminated region;

(b) a focusing optics for focusing the beam onto a focal plane and collecting at least a portion of the returned light;

(c) a focus detection unit comprising an imaging optics and a detector, having a sensing surface responsive to light impinging thereon for generating data representative thereof, the imaging optics receiving at least a part of the collected returned light and forming first and second images on said sensing surface, wherein the first and second images are formed by first and second spatially separated substantially identical light components of the collected returned light, respectively, propagating symmetrically relative to an optical axis of said focusing optics, a position of the first image relative to the second image being indicative of the position of the article relative to the focal plane.

The main concept underlying the idea of the present invention is based on the following. It is known that light waves returned from in-focus and out-of-focus planes and passed through the focusing lens have substantially flat and spherical wave fronts, respectively. Consequently, information indicative of distortions produced at any out-of-focus location is actually the contained in light propagating within a periphery region of the optical axis, rather than that associated with a paraxial area. The term "periphery regions" used herein signifies regions of light propagation along an optical axis making substantially large angles to and lying substantially far from the optical axis. Hence, it is desired to analyze light components propagating within the periphery regions, to detect the focus error.

In this connection, to detect any out-of-focus location, i.e. lying either before or after the focal plane, two light components propagating within different periphery regions symmetrical relative to the optical axis should be collected and imaged. On the other hand, in order to enable successful identification of the "before-focus" and "after-focus" images, a suitable recognizable difference between these two images should be introduced. This is implemented by creating two images on a common sensing surface in such a manner that they form a line when the illuminated elongated region is in focus, and displace in two opposite directions relative to each other when the illuminated region moves out of focus. The images are centrally symmetrical with respect to an intersection point between the sensing surface and the optical axis of light propagation. Each of the images moves in the opposite direction with respect to the other, depending on "before-focus" or "after-focus" direction of the article displacement. In other words, the images are spaced from each other along two mutually perpendicular axes, when in the out of focus position of the illuminated region.

The same focusing optics, typically composed of one or more objective lens, serves for collecting light returned from the illuminated region, and presents an aperture stop whose physical dimensions define the collected light portion (a certain solid angle). The collected light, which contains information of the illuminated region and of the aperture stop, is directed towards the sensing surface through the imaging optics.

The imaging optics comprises a first lens assembly that forms an image of the aperture stop in a first plane, conjugate to the aperture stop plane. A blocking plate having two transmitting slits is located in this conjugate plane at a location of the expected image. The slits have substantially identical shape and dimensions, and are centrally symmetrical with respect to an intersection point between the optical axis and the conjugate plane. The slits are spaced from each other so as to be in the optical path of two light components representative of the images of two periphery regions of the aperture stop, symmetrical relative to the optical axis.

The imaging optics further comprises a second lens assembly installed in the optical path of light passed through the slits. This lens assembly is designed to form an image of the illuminated elongated region along an axis perpendicular to this region, in a second plane, conjugate to the aperture stop plane along an axis parallel to the illuminated region. The sensing surface is placed within this second conjugate plane at a location of the expected image.

A third lens assembly of the imaging optics is mounted in the optical path of light ensuing from the second lens assembly, and is capable of forming an image of the slits along an axis parallel to the illuminated region on the sensing surface.

Each of the two images so obtained on the sensing surface extends along two mutually perpendicular axes, corresponding to the projections of the slit image and illuminated region image, respectively. Generally speaking, the images obtained on the sensing surface are indicative of the illuminated elongated region as "observed" through the aperture stop (objective lens) within its periphery regions. When the illuminated region is in focus of the objective lens, the two images form a line. When the illuminated region is out of focus, two substantially identical images are obtained, which are centrally symmetrical relative to the intersection point of the sensing surface and the optical axis, and are spaced from each other along two mutually perpendicular axes. By detecting relative displacements of the images, "before-focus" and "after-focus" positions of the illuminated region can be easily identified.

By equipping the apparatus with a feedback loop, typically consisting of a suitable processor interconnected between an output circuit of the detector and a servomotor coupled to the article support stage or/and to the focusing optics, a focus error correction can be successfully carried out.

The present invention may be used with an optical inspection system, by simply adding a separate detection-collection means for collecting light returned from the illuminated region at elevation angles other than that collected by the focusing optics. There is no need for a separate illumination unit.

According to another aspect of the present invention, there is provided a method of maintaining a desired position of the article during processing, the method comprising:

(i) generating a light beam for illuminating an elongated region of the article;

(ii) focusing the beam onto a focal plane, and collecting at least a portion of returned light reflected from the article, with a focusing optics defining an optical axis of light propagation;

(iii) forming first and second images formed by first and second spatially separated substantially identical light components of the collected returned light, respectively, propagating symmetrically relative to the optical axis of said focusing optics, a position of the first image relative to the second image being indicative of the position of the article relative to the focal plane;

(iv) detecting said first and second images and generating data representative thereof.

According to yet another aspect of the present invention, there is provided a focus error detection method comprising:

passing an incident beam through a focusing optics and illuminating an elongated region;

collecting at least a portion of light returned from said elongated region;

separating first and second spatially separated substantially identical light components of the collected returned light propagating symmetrically relative to an optical axis of said focusing optics within regions making substantially large angles to and lying outside said optical axis; and passing the separated first and second light components through an imaging optics and forming first and second images on a sensing surface, a position of the first image relative to the second image being indicative of the position of the elongated region relative to a focal plane of said focusing optics.

More specifically, the present invention is used with an optical inspection system for inspecting wafers, and is therefore described below with respect to this application.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

Figure 1:
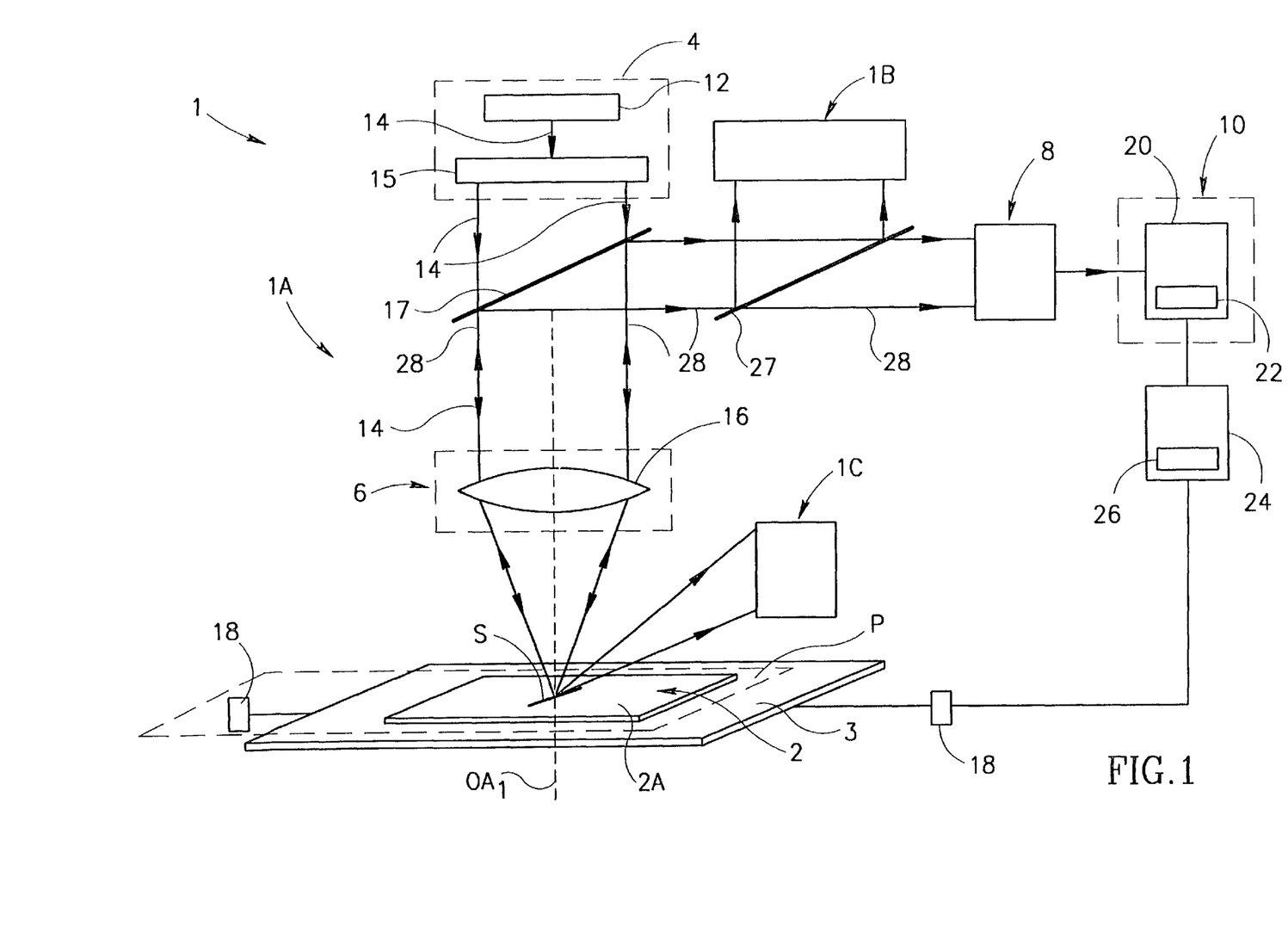
FIG. 1 is a schematic illustration of the main components of a system utilizing an apparatus according to the invention.

Reference is first being made to FIG. 1 illustrating an optical inspection system, generally designated 1, associated with a wafer 2 to be inspected. The system 1 comprises a scanning apparatus 1a, a bright-field detection unit 1b and a dark-field detection unit 1c. The wafer 2 is typically located on a support state 3 translating the wafer within an inspection plane. The construction and operation of the detection units 1b and 1c do not form the part of the present invention and therefore need not be specifically described except to note the following. The dark-field detection unit 1c comprises a suitable detector and an appropriately oriented collecting optics, while the bright field detection unit 1b includes a charge coupled device (CCD) camera (not shown) receiving a part of returned radiation collected with the apparatus 1a, as will be described more specifically further below.

The apparatus 1a consists of an illumination unit 4, a focusing-collecting optics 6, an imaging optics 8 and a detection unit 10. The illumination unit comprises a laser source 12 emitting an incident beam 14, and a deflector 15 which may be an acousto-optic element, a mirror, or the like, causing the beam 14 to scan along a surface 2a of the wafer 2. It should be noted that a linear beam could be used for the same purpose, i.e. for illuminating an elongated region on the surface 2a.

The focusing-collecting optics 6 is typically an objective lens 16 (or a plurality of such lenses). The lens 16 focuses the deflected beam 14 onto a scan line S (constituting the elongated region) on the surface 2a. A servomotor 18 is coupled to the stage 3 for driving a reciprocating movement of the stage along an optical axis $OA_1$ of the lens 16 to change the position of its focal plane P relative to the surface 2a. Alternatively or additionally, a similar servomotor may be associated with the lens 16.

Further provided is a beam splitter 17 that separates the incident and returned radiation and directs the returned radiation towards the detection unit 10. According to the present example, the beam splitter 17 is in the form of a partially transparent mirror that transmits and reflects radiation impinging thereon from two opposite directions, respectively, namely transmits the incident radiation and reflects the returned radiation. Alternatively, a polarizing beam splitter equipped with phase-shifting plates may be used.

The detection unit 10 comprises a detector 20, for example a charge coupled device (CCD) camera having a plurality of sensing elements (not shown) that typically detect light signals and generate electrical output representative thereof, to be transmitted through an output circuit 22. The sensing element define together a sensing surface 21. The CCD camera could be replaced by a position sensitive detector.

Interconnected between the servomotor 18 and the output circuit 22 is a processor 24. The construction and operational principles of the processor 24 do not form a part of the present invention and may be of any known kind. It should, however, be noted that the processor 24 is responsive to the output of the detector unit 10 for analyzing the location of the surface 2a relative to the focal plane P and generating a so-called "focus correction signal", upon detecting that the surface 2a moves away from the focal plane P. Thus, the CCD output circuit 22, processor 24 and servomotor 18 constitute together a feedback loop. The processor 24 is optically provided with a display 26 for displaying obtained images.

Also provided is a beam splitter 27 accommodated in the optical path of the collected returned light reflected from the mirror 17. The beam splitter 27 is a semi-transparent mirror that partly transmits and partly reflects radiation impinging thereon. Hence, the mirror 27 reflects a part of the collected radiation towards the detection unit 1b, while transmitting the other part of the collected radiation towards the imaging optics 8.

The apparatus 1a operates in the following manner. The incident beam 14 propagates through the beam splitter 17 and objective lens 16, and illuminates the line S, while being focused onto the focal plane P, which may occasionally not coincide with the surface 2a. The beams' propagation is shown here schematically to facilitate the illustration of the main components and operational principles of the apparatus 1a. Light portion, generally at 28, returned (reflected) from the scan line S, is collected by the lens 16. The lens 16 constitutes an aperture stop that defines the collected light portion 28. The collected light 28 is reflected to the mirror 27, which allows the transmission of the part of light 28 towards the detection unit 10 through the imaging optics 8, and reflects the other part of light 28 towards the detection unit 1b. The imaging optics 8 forms images indicative of the position of the surface 2a relative to the focal plane P on the sensing surface 21, as will be described more specifically further below.

Figure 2A:
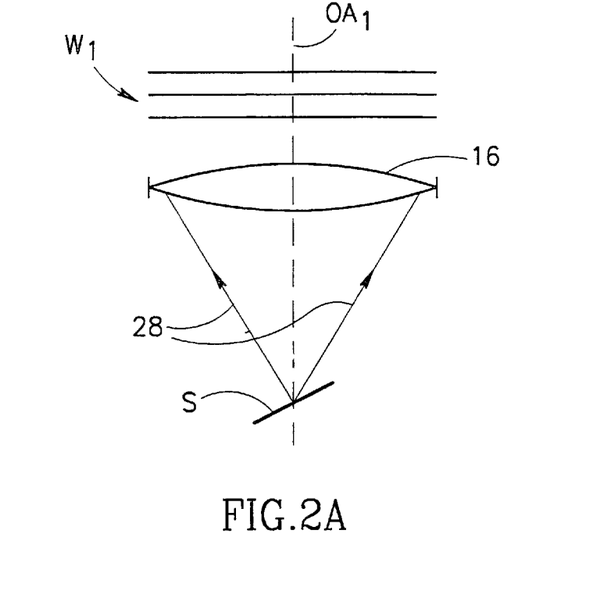
FIGS. 2a and 2b illustrate the main principles underlying the implementation of an auto-focusing technique in the apparatus of FIG. 1.
Figure 2B:
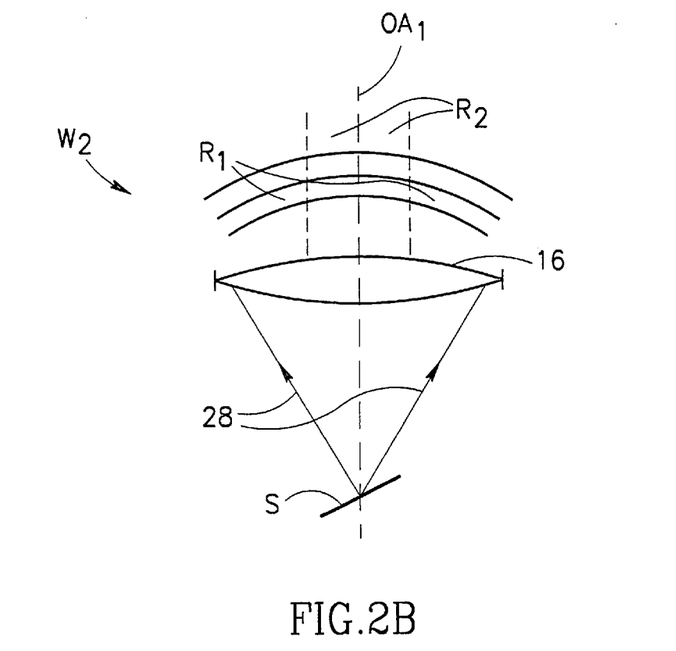

Turning now to FIGS. 2a and 2b, wave fronts $W_1$ and $W_2$ of the light 28, returned from the illuminated line S and passed through the aperture stop 16, are illustrated, corresponding to in-focus and out-of focus locations of the illuminated line S, respectively. The in-focus location is typically characterized by a substantially flat-shaped wave front $W_1$ (FIG. 2a), while the out-of-focus location is characterized by a substantially spherical wave front $W_2$ (FIG. 2b). As shown in FIG. 2b, the returned light 28 propagates within regions $R_1$ and $R_2$, which lie substantially far from and close to the optical axis $OA_1$, respectively. In other words, the regions $R_1$ and $R_2$ are periphery and paraxial regions, respectively, with respect to the optical axis $OA_1$. Significant curvatures of the wave front $W_2$ are located within the periphery regions $R_1$, whilst being relatively negligible within the paraxial regions $R_2$. The periphery regions of the lens are more sensitive to an out-of-focus position of the light source. Therefore, the periphery regions $R_1$ of the light propagation contain the main information indicative of the out-of-focus location of the line S. This is associated with the principles of light propagation through a lens: with respect to rays coming from the same point on the optical axis of the lens and impinging on the lens at different distances from the optical axis, the further a ray emerges from the optical axis of the lens, the stronger it is refracted.

Figure 3:
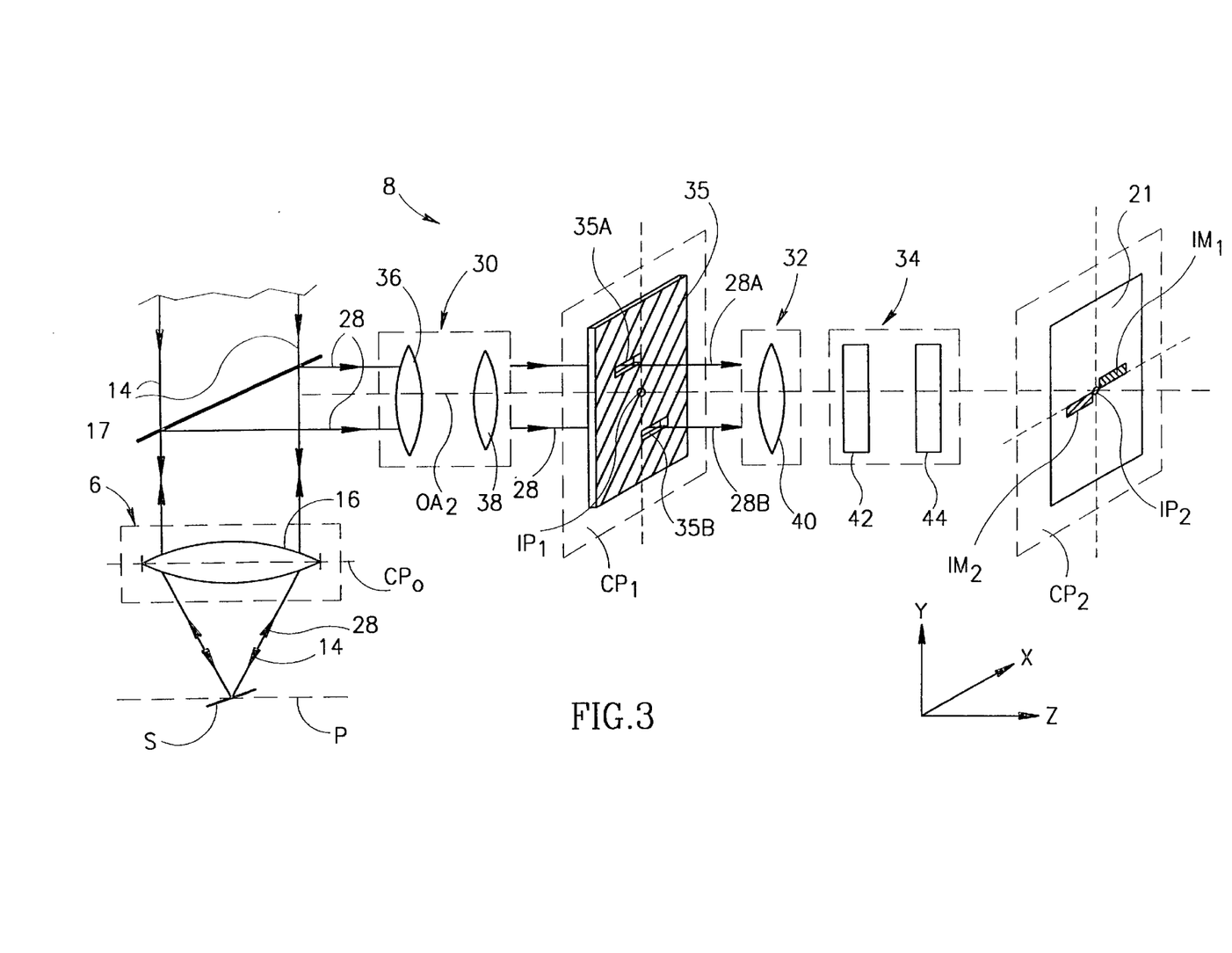
FIG. 3 schematically illustrates the main constructional elements of an imaging optics of the apparatus of FIG. 1.

Reference is made to FIG. 3, illustrating the construction of the imaging optics 8 utilizing the above teachings of FIGS. 2a and 2b to form images indicative of the wafer's position relative to the focal plane P, on the sensing surface 21. The imaging optics 8 is composed of three functionally different lens arrangements, generally designated 30, 32 and 34, respectively, which define a common optical axis $OA_2$ of light propagation. A plate 35 is interposed between the lens arrangements 30 and 32, and is oriented perpendicular to the optical axis $OA_2$. The plate 35 is formed with a pair of slits 35a and 35b representing two transmitting regions surrounded by blocking regions of the plate. The slits pick out two light components from light impinging onto the plate 35 and transmit them towards the lens arrangement 32. The slits 35a and 35b are identical in the shape and dimensions and are centrally symmetrical relative to an intersection point $IP_1$ between the plate 35 and the optical axis $OA_2$, the purpose of which will be explained further below.

Generally speaking, the arrangement 30, in combination with the beam splitter 17, represents a translation matrix to move image formation away from optical interfaces defined by the focusing optics 6. The arrangement 30 comprises two lenses 36 and 38 that operate in a telescopic mode to form a magnified image of the aperture stop 16 in a plane $CP_1$. The image magnification is required to adapt the exit pupil size (i.e. the size of the aperture stop 16) to the target size (i.e. sensing surface 21 of the CCD camera 20). A plane $CP_0$, defined by the location of the aperture stop 16 ("object"), and the plane $CP_1$ are conjugate planes, i.e. images of each other. The lens arrangement 30 is designed to form the image of the aperture stop 16 in the plane $CP_1$.

The plate 35 is accommodated within the conjugate plane $CP_1$ at the location of the expected magnified image of the aperture stop 16. Since light impinging onto the plate 35 is the "image" of the aperture stop 16, it contains the same information of the out-of-focus distortions as the "object" light 28 impinging onto the aperture stop 16. Images of the regions $R_1$ are aligned in accordance with the known image magnification produced by the lens arrangement 30. To this end, the slits 35a and 35b are provided at those locations on the plate 35 that interact with the light components representative of the images of the regions $R_1$, i.e. propagating within the symmetrical periphery regions with respect to the optical axis $OA_2$. Light ensuing from the plate 35 is in the form of two components 28a and 28b. They are representative of the image of the aperture stop 16 formed by light components of the collected light 28 propagating substantially within the periphery regions $R_1$.

Light components 28a and 28b passed through the plate 35 impinge onto the lens arrangement 32. The latter consists of a spherical lens 40 (or plurality of such lenses), the sensing surface 21 being disposed in a focal plane of the lens arrangement 32. The lens 40 forms an image of the scan line S along the Y-axis in its focal plane. The X-, Y and Z-axes extend, respectively, along the scan line S, perpendicular to the scan line, and along the optical axis $OA_2$.

The lens arrangement 34 comprises an appropriate number of cylindrical lenses, two in the present example, designated respectively 42 and 44. The lenses 42 and 44 operate together for forming an image of the slits 35a and 35b in a plane $CP_2$, which is conjugate to the plane $CP_0$ along the X-axis, i.e. parallel to the scan line S. The CCD camera 20 is located such that its sensing surface 21 is positioned in the plane $CP_2$. The slits' image along the X-axis is magnified in order to be projected onto the entire sensing surface 21.

Thus, two images $IM_1$ and $IM_2$ are obtained on the sensing surface 21 of the CCD camera, actuating corresponding sensing elements, each representing a pixel of the image. Each of the images is formed by a corresponding one of the light components 28a and 28b, picked out by the respective slit.

Owing to the above design of the imaging optics 8, and to the provision of the plate 35 and sensing surface 21 located as described above, the finally obtained images $IM_1$ and $IM_2$ contain the following information:

the imaging of the aperture stop formed by a light component propagating within a corresponding one of the regions $R_1$;

the image of the corresponding slit along the X-axis (parallel to the scan line S);

the image of the scan line S along the Y-axis (perpendicular to the scan line S).

Each of the images $IM_1$ and $IM_2$ is in the form of an elongated region extending along the X- and Y-axes, representing the slit image projection along the X-axis and the scan line image projection along the Y-axis. When the scan line S is located in the focal plane P of the objective lens 16 (i.e. the aperture stop), the images $IM_1$ and $IM_2$ are merged into a line, while being spatially separated when in any out-of-focus position of the scan line S. Moreover, the images are centrally symmetrical relative to the intersection point IP, and are spaced from each other along two mutually perpendicular axes.

Figure 4A:
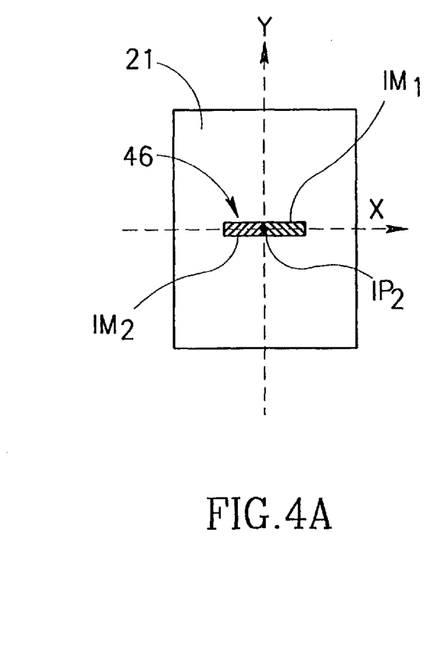
FIGS. 4a to 4c illustrate the principles of the focus error detection utilized in the apparatus of FIG. 1.
Figure 4B:
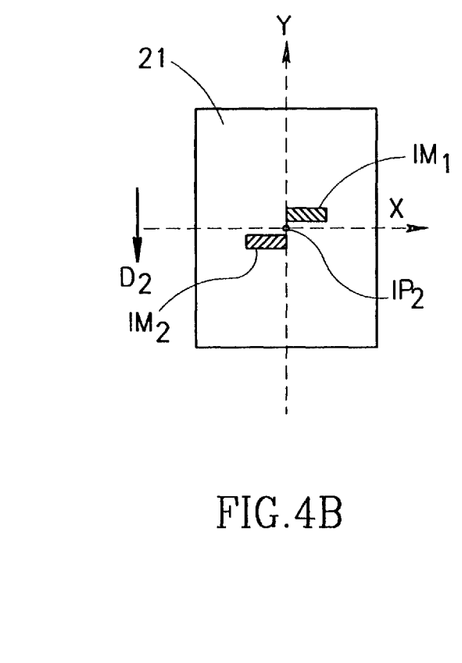
Figure 4C:
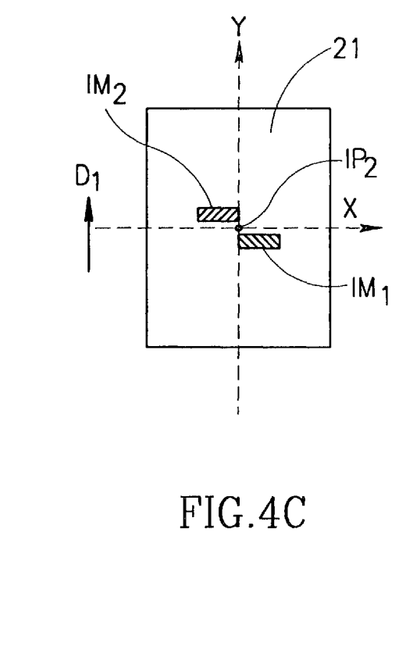

FIGS. 4a, 4b and 4c illustrate in-focus and two out-of-focus situations, respectively, as presented on the sensing surface 21. As seen in FIG. 4a, the images $IM_1$ and $IM_2$ are aligned in a line 46 corresponding to the desired in-focus position of the surface 2a, so called "best focus". Before the detection procedure begins, the "best focus" should be found. FIG. 4b illustrates that when the surface 2a moves out of focus in one direction, the images $IM_1$ and $IM_2$ displace in two opposite directions $D_1$ and $D_2$, respectively. When the surface 2a moves out of focus in the other, opposite direction, the images $IM_1$ and $IM_2$ displace in the directions $D_2$ and $D_1$, respectively (FIG. 4c).

The above effect is associated with the fact that light beams coming from spaced-apart locations on the optical axis (i.e. before-focus, in-focus and after-focus) impinge onto the same location on the lens at different angles. Therefore, these beams are differently refracted by the lens. When the scan line S is located in the focal plane of the lens, the collected light beams propagate parallel to the optical axis of the lens. When the scan line moves from the in-focus location towards and away from the lens, the collected light beams form larger and smaller angles with the optical axis respectively. The two image parts $IM_1$ and $IM_2$ are formed by two light components propagating symmetrically to the optical axis. Therefore, images corresponding to the before-focus and after-focus locations of the scan line displace into two opposite directions, respectively, relative to the best focus image.

As indicated above, the periphery regions of the lens due to their curvature provide stronger refraction than the central region of the lens. Hence, the slight movement of the scan line from the in-focus position causes stronger displacement of the beams collected with the periphery regions of the lens, as compared to that of the central region thereof.

The apparatus 1a is tested before the detection procedure, namely a so-called learning mode is applied in order to detect which one of the situations shown in FIGS. 4b and 4c corresponds to the "before-focus" location, and which one corresponds to the "after-focus" location of the surface 2a. It should be specifically noted that the present technique needs the scan region S to be substantially elongated, while having no specific requirements to the shape of the slits 35a and 35b, provided they are centrally symmetrical with respect to the intersection point IP between the conjugate plane $CP_1$ and the optical axis $OA_2$, and are spaced from each other along two mutually perpendicular axes.

Turning back to FIG. 1, the sensing elements of the CCD camera 20 operate in a conventional manner to produce electrical signals in response to the sensed light and to transmit the electrical signals to the output circuit 22. The processor 24 analyzes the output signals coming from the detector 20 and generates the focus correction signal, optionally, concurrently presenting the images $IM_1$ and $IM_2$ on the display 26. The servomotor 18 in response to the focus correction signal operates accordingly to provide the necessary displacement of the wafer 2 with respect to the objective lens 16.

Those skilled in the art will readily appreciate that various modifications and changes may be applied to the preferred embodiments of the invention as hereinbefore exemplified without departing from its scope as defined in and by the appended claims. For example, the article to be maintained at a desired position may be an information carrier, the surface to be maintained in the focal plane being that defined by an addressed information layer.

What is claimed is:

1. An optical apparatus for maintaining a desired position of an article, the apparatus comprising:

(a) an illumination unit generating a light beam for illuminating an elongated region of the article and producing light returned from the illuminated region;

(b) a focusing optics for focusing the beam onto a focal plane and collecting at least a portion of the returned light;

(c) a focus detection unit comprising an imaging optics and a detector, having a sensing surface responsive to light impinging thereon for generating data representative thereof, the imaging optics receiving at least a part of the collected returned light and forming first and second images on said sensing surface, wherein the first and second images are formed by first and second spatially separated substantially identical light components of the collected returned light, respectively, propagating symmetrically relative to an optical axis of said focusing optics, a position of the first image relative to the second image being indicative of the position of the article relative to the focal plane.

2. The apparatus according to claim 1, wherein said first and second light components propagate towards the focusing optics, making substantially large angles to and lying outside said optical axis.

3. The apparatus according to claim 1, wherein said focusing optics comprises an objective lens arrangement defining said focal plane and representing an aperture stop for collecting said portion of the returned light.

4. The apparatus according to claim 1, wherein said first and second images form a line, when in the desired in-focus position of the illuminated region, and are differently spaced from each other when in two positions of the illuminated region at opposite sides of the focal plane, respectively.

5. The apparatus according to claim 1, wherein said first and second images are centrally symmetrical with respect to an intersection between the sensing surface and the optical axis of light propagation.

6. The apparatus according to claim 5, wherein said first and second images are spaced from each along two mutually perpendicular axes when in the out of focus position of the illuminated region.

7. The apparatus according to claim 3, wherein said imaging optics comprises first and second parallel spaced-apart slits located in a first conjugate plane of said aperture stop for picking out said first and second light components, respectively, from the collected returned light, wherein the slits are centrally symmetrical relative to an intersection point of said conjugate plane and an optical axis of the imaging optics.

8. The apparatus according to claim 7, wherein said slits are spaced from each other along two mutually perpendicular axes.

9. The apparatus according to claim 7, wherein the imaging optics comprises:

a first lens assembly accommodated in the optical path of the collected light upstream of the slits, the first lens assembly being capable of forming an image of the aperture stop in the first conjugate plane;

a second lens assembly accommodated downstream of the slits, and being capable of forming an image of the illuminated region along an axis perpendicular to the illuminated region, in a second plane conjugate to the aperture stop plane along an axis parallel to the illuminated region; and a third lens assembly receiving light ensuing from the second assembly and forming images of said first and second slits along an axis parallel to the illuminated region, in the second conjugate plane of the aperture stop.

10. The apparatus according to claim 9, wherein said sensing surface is located in the second conjugate plane.

11. The apparatus according to claim 1, and also comprising a beam splitter accommodated in the optical path of the incident beam and of the collected returned light, for directing the collected returned light toward the focus detection unit.

12. The apparatus according to claim 1, and also comprising a display coupled to an output of the detector for displaying said first and second images.

13. The apparatus according to claim 1, and also comprising a processor coupled to an output of the detector for receiving data representative of said first and second images and generating a signal indicative of said position of the article relative to the focal plane.

14. The apparatus according to claim 13, wherein said processor generates a focus error correction signal to be used for displacing the article and focusing optics with respect to each other to maintain the illuminated region within the focal plane.

15. The apparatus according to claim 1, and also comprising a feedback loop responsive to signals indicative of the detected position of the article for generating a focus error correction signal and adjusting the position of the article to place the illuminated region in the focal plane of the focusing optics.

16. The apparatus of claim 1, wherein a shape of a wavefront of the returned light is indicative of the position of the article to the focal plane and the first and second images are formed in accordance with the shape of the wavefront of the returned light.

17. The apparatus of claim 16, wherein the shape of the wavefront of the returned light is substantially flat when the article is in focus and substantially spherical when the article is out of focus.

18. A system for an optical inspection of an article, comprising an optical apparatus for maintaining a desired position of the article, and at least one detection unit, wherein said optical apparatus comprises:
an illumination unit generating a light beam for illuminating an elongated region of the article and producing light returned from the illuminated region;
a focusing optics for focusing the beam onto a focal plane and collecting at least a portion of the returned light;
a focus detection unit comprising an imaging optics and a detector, having a sensing surface responsive to light impinging thereon for generating data representative thereof, the imaging optics receiving at least a part of the collected returned light and forming first and second images on said sensing surface, wherein the first and second images are formed by first and second spatially separated substantially identical light components of the collected returned light, respectively, propagating symmetrically relative to an optical axis of said focusing optics, a position of the first image relative to the second image being indicative of the position of the article relative to the focal plane;

said at least one detection unit comprises:
a light collecting optics and a detection means, the light collecting optics being capable of collecting light returned from the article at elevation angles different from an elevation angle of collection of said portion of the returned light defined by said focusing optics.

19. An optical apparatus for maintaining a desired position of an article, the apparatus comprising:

(a) an illumination unit generating a light beam for illuminating an elongated region of the article and producing light returned from the illuminated region;

(b) a focusing optics for focusing the beam onto a focal plane and collecting at least a portion of the returned light; a shape of a wavefront of the returned light being indicative of the position of the article relative to the focal plane;

(c) a focus detection unit comprising an imaging optics and a detector, having a sensing surface responsive to light impinging thereon for generating data representative thereof, the imaging optics receiving at least a part of the collected returned light and forming first and second images on said sensing surface, wherein the first and second images are formed in accordance with the shape of the wavefront of the returned light, a position of the first image relative to the second image being indicative of the position of the article relative to the focal plane.

20. The method of claim 19, wherein the shape of the wavefront of the returned light is substantially flat when the article is in focus and substantially spherical when the article is out of focus.

21. A focus error detection method comprising:

passing an incident beam through a focusing optics and illuminating an elongated region;

collecting at least a portion of light returned from said elongated region;

separating first and second spatially separated substantially identical light components of the collected returned light propagating symmetrically relative to an optical axis of said focusing optics within regions making substantially large angles to and lying outside said optical axis; and passing the separated first and second light components through an imaging optics and forming first and second images on a sensing surface, a position of the first image relative to the second image being indicative of the position of the elongated region relative to a focal plane of said focusing optics.

22. The method according to claim 21, wherein said first and second images form a line when said elongated region is located in said focal plane, and are differently spaced from each other when said elongated region is located at opposite sides of the focal plane, respectively.

23. The method according to claim 21, wherein said first and second images are centrally symmetrical with respect to an intersection between the sensing surface and the optical axis of light propagation towards the sensing surface.

24. The method according to claim 23, wherein said first and second images are spaced from each other along two mutually perpendicular axes when said elongated region is located out of said focal plane.

25. A system for an optical inspection of an article comprising an optical apparatus for maintaining a desired position of the article, a detection unit and a beam splitter, wherein said optical apparatus comprises:

an illumination unit generating a light beam for illuminating an elongated region of the article and producing light returned from the illuminated region;

a focusing optics for focusing the beam onto a focal plane and collecting at least a portion of the returned light;

a focus detection unit comprising an imaging optics and a detector, having a sensing surface responsive to light impinging thereon for generating data representative thereof, the imaging optics receiving at least a part of the collected returned light and forming first and second images on said sensing surface, wherein the first and second images are formed by first and second spatially separated substantially identical light components of the collected returned light, respectively, propagating symmetrically relative to an optical axis of said focusing optics, a position of the first image relative to the second image being indicative of the position of the article relative to the focal plane;

said detection unit receives a part of the collected returned light propagating towards the focus detection unit; and said beam splitter separates said part of the collected returned light and directs it to said detection unit.

26. A method of maintaining a desired position of the article during processing, the method comprising:

(i) generating a light beam for illuminating an elongated region of the article;

(ii) focusing the beam onto a focal plane, and collecting at least a portion of returned light reflected from the article, with a focusing optics defining an optical axis of light propagation;

(iii) forming first and second images using a first and second spatially separated substantially identical light components of the collected returned light, respectively, propagating symmetrically relative to the optical axis of said focusing optics, a position of the first image relative to the second image being indicative of the position of the article relative to the focal plane;

(iv) detecting said first and second images and generating data representative thereof.

27. The method according to claim 26, wherein the focusing and collecting comprises passing the incident beams and the returned light through an objective lens defining an aperture stop of light collection.

28. The method according to claim 26, wherein said forming of the first and second images comprising the steps of:

receiving the collected light and forming a first image of the aperture stop in a first plane conjugate to the aperture stop plane;

selecting from light representative of said first image first and second light components representing an image of two light components propagating towards the focusing optics within two regions symmetrical with respect to the optical axis, making substantially large angles to and lying outside said optical axis;

receiving said first and second light components representative of said first image and forming a second image of the illuminated region along an axis perpendicular to the illuminated region, in a second plane conjugate to the aperture stop plane along an axis parallel to the illuminated region; and receiving light representative of said second image and forming an image of said first and second light components along an axis parallel to the illuminated region, in said second plane.

29. The method of claim 26, wherein a shape of a wavefront of the returned light is indicative of the position of the article relative to the focal plane and the first and second images are formed in accordance with the shape of the wavefront of the returned light.

30. The method of claim 29, wherein the shape of the wavefront of the returned light is substantially flat when the article is in focus and substantially spherical when the article is out of focus.

31. A method for maintaining a desired position of an article, the method comprising:
   (a) generating a light beam for illuminating an elongated region of the article;
   (b) focusing the beam onto a focal plane, and collecting at least a portion of the returned light; a shape of a wavefront of the returned light being indicative of the position of the article relative to the focal plane;
   (c) forming first and second images of the article in accordance with the shape of the wavefront of the returned light, a position of the first image relative to the second image being indicative of the position of the article relative to the focal plane.

32. The method of claim 31, wherein the shape of the wavefront of the returned light is substantially flat when the article is in focus and substantially spherical when the article is out of focus.

* * * * *